(12) United States Patent
Murata

(10) Patent No.: US 12,200,380 B2
(45) Date of Patent: *Jan. 14, 2025

(54) SOLID-STATE IMAGING DEVICE AND ELECTRONIC CAMERA

(71) Applicant: NIKON CORPORATION, Tokyo (JP)

(72) Inventor: Hironobu Murata, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/101,863

(22) Filed: Jan. 26, 2023

(65) Prior Publication Data

US 2023/0171517 A1    Jun. 1, 2023

Related U.S. Application Data

(63) Continuation of application No. 16/841,983, filed on Apr. 7, 2020, now Pat. No. 11,588,991, which is a
(Continued)

(30) Foreign Application Priority Data

Jan. 13, 2012    (JP) ................... 2012-005270

(51) Int. Cl.
*H04N 25/702* (2023.01)
*H01L 27/146* (2006.01)
(Continued)

(52) U.S. Cl.
CPC ..... *H04N 25/702* (2023.01); *H01L 27/14605* (2013.01); *H01L 27/14609* (2013.01);
(Continued)

(58) Field of Classification Search
CPC ...... H04N 25/702; H04N 5/907; H04N 23/54; H04N 23/673; H04N 25/134;
(Continued)

(56) References Cited

U.S. PATENT DOCUMENTS 6,958,862 B1 * 10/2005 Joseph ............. H01L 27/14625
349/95
9,385,148 B2 * 7/2016 Murata ............. H01L 27/14647
(Continued)

FOREIGN PATENT DOCUMENTS

AU    2004200841 A1    3/2004
CN    101821657 A    9/2010
(Continued)

OTHER PUBLICATIONS

Jun. 2, 2015 Office Action issued in Japanese Patent Application No. 2014-117789.
(Continued)

*Primary Examiner* — Ahmed A Berhan
*Assistant Examiner* — John H Morehead, III
(74) *Attorney, Agent, or Firm* — Oliff PLC

(57) ABSTRACT

A solid-state imaging device includes a second image sensor having an organic photoelectric conversion film transmitting a specific light, and a first image sensor which is stacked in layers on a same semiconductor substrate as that of the second image sensor and which receives the specific light having transmitted the second image sensor, in which a pixel for focus detection is provided in the second image sensor or the first image sensor. Therefore, an AF method can be realized independently of a pixel for imaging.

17 Claims, 14 Drawing Sheets

Related U.S. Application Data continuation of application No. 15/485,596, filed on Apr. 12, 2017, now Pat. No. 10,674,102, which is a continuation of application No. 15/088,436, filed on Apr. 1, 2016, now Pat. No. 9,654,709, which is a continuation of application No. 13/736,204, filed on Jan. 8, 2013, now Pat. No. 9,385,148.

(51) Int. Cl.
| | |
|---|---|
| H04N 5/907 | (2006.01) |
| H04N 13/236 | (2018.01) |
| H04N 13/271 | (2018.01) |
| H04N 23/54 | (2023.01) |
| H04N 23/67 | (2023.01) |
| H04N 23/84 | (2023.01) |
| H04N 25/13 | (2023.01) |
| H10K 19/20 | (2023.01) |
| H10K 39/32 | (2023.01) |

(52) U.S. Cl.
CPC .. *H01L 27/14621* (2013.01); *H01L 27/14627* (2013.01); *H01L 27/14636* (2013.01); *H01L 27/14645* (2013.01); *H01L 27/14647* (2013.01); *H04N 5/907* (2013.01); *H04N 13/236* (2018.05); *H04N 13/271* (2018.05); *H04N 23/54* (2023.01); *H04N 23/673* (2023.01); *H04N 23/843* (2023.01); *H04N 25/134* (2023.01); *H04N 25/136* (2023.01); *H10K 19/20* (2023.02); *H10K 39/32* (2023.02); *H01L 27/1464* (2013.01)

(58) Field of Classification Search
CPC ............ H04N 25/136; H01L 27/14605; H01L 27/14609; H01L 27/14621; H01L 27/14627; H01L 27/14636; H01L 27/14645; H01L 27/14647; H01L 27/1464
See application file for complete search history.

(56) References Cited

U.S. PATENT DOCUMENTS

| | | | |
|---|---|---|---|
| 2004/0119843 A1 | 6/2004 | Hoshuyama | |
| 2006/0197172 A1 | 9/2006 | Oda | |
| 2007/0076108 A1* | 4/2007 | Misawa | H01L 27/14609 348/E3.018 |
| 2007/0237512 A1 | 10/2007 | Kusaka | |
| 2007/0279501 A1 | 12/2007 | Goto et al. | |
| 2008/0084483 A1* | 4/2008 | Kusaka | H04N 25/702 348/222.1 |
| 2008/0218611 A1* | 9/2008 | Parulski | H04N 23/741 348/262 |
| 2008/0219654 A1* | 9/2008 | Border | H04N 23/673 396/89 |
| 2008/0259202 A1 | 10/2008 | Fujii | |
| 2008/0303072 A1* | 12/2008 | Lee | H04N 25/17 257/292 |
| 2009/0072122 A1 | 3/2009 | Tada et al. | |
| 2009/0085135 A1* | 4/2009 | Bang | H01L 27/1469 257/E31.127 |
| 2009/0200584 A1* | 8/2009 | Tweet | H04N 25/17 257/292 |
| 2010/0141771 A1 | 6/2010 | Hu | |
| 2010/0157117 A1* | 6/2010 | Wang | H01L 27/14621 348/E5.091 |
| 2010/0165176 A1 | 7/2010 | Taniguchi | |
| 2010/0277625 A1* | 11/2010 | Utsugi | H04N 25/134 348/E9.037 |
| 2010/0328503 A1 | 12/2010 | Shintani et al. | |
| 2011/0001128 A1* | 1/2011 | Kim | H10K 85/655 438/57 |
| 2011/0032376 A1 | 2/2011 | Takizawa | |
| 2011/0109776 A1* | 5/2011 | Kawai | H01L 27/1463 348/294 |
| 2011/0128430 A1* | 6/2011 | Fossum | H04N 25/70 257/E31.127 |
| 2011/0176795 A1* | 7/2011 | Won | G03B 13/36 396/137 |
| 2011/0204461 A1* | 8/2011 | Lee | H01L 27/14647 257/E31.127 |
| 2011/0317048 A1* | 12/2011 | Bai | H01L 27/14607 257/443 |
| 2012/0026370 A1* | 2/2012 | Oike | H04N 25/78 348/E5.091 |
| 2012/0049044 A1* | 3/2012 | Kuboi | H01L 27/1464 257/E31.124 |
| 2012/0062786 A1* | 3/2012 | Hamano | H04N 23/633 396/125 |
| 2012/0097946 A1* | 4/2012 | Gidon | H01L 27/14692 257/53 |
| 2012/0193515 A1* | 8/2012 | Agranov | H04N 13/204 250/214 P |
| 2012/0205765 A1* | 8/2012 | Hynecek | H01L 27/14632 257/E31.127 |
| 2013/0234029 A1* | 9/2013 | Bikumandla | H01L 27/14649 257/432 |

FOREIGN PATENT DOCUMENTS

| | | |
|---|---|---|
| CN | 101193209 B | 9/2012 |
| JP | 2001-021792 A | 1/2001 |
| JP | 2004-200902 A | 7/2004 |
| JP | 2006-237136 A | 9/2006 |
| JP | 2007-011070 A | 1/2007 |
| JP | 2007-67075 A | 3/2007 |
| JP | 2007-282109 A | 10/2007 |
| JP | 2007-311550 A | 11/2007 |
| JP | 2007-324405 A | 12/2007 |
| JP | 2008-258474 A | 10/2008 |
| JP | 2009-099867 A | 5/2009 |
| JP | 2009-130239 A | 6/2009 |
| JP | 2010020016 A | 1/2010 |
| JP | 2010-141140 A | 6/2010 |
| JP | 2010-532869 A | 10/2010 |
| JP | 2011-103335 A | 5/2011 |
| JP | 4807131 B2 | 11/2011 |
| WO | 2009/104417 A1 | 8/2009 |

OTHER PUBLICATIONS

Sep. 29, 2015 Search Report issued in European Patent Application No. 13735697.8.
Nov. 2, 2015 Office Action issued in Chinese Patent Application No. 201380005298.9.
Dec. 15, 2015 Office Action issued in Japanese Patent Application No. 2014-117789.
Nov. 11, 2015 Office Action cited in Russian Patent Application No. 2014133174.
Apr. 15, 2016 Office Action issued in Korean Patent Application No. 10-2014-7022562.
Aug. 12, 2016 Office Action issued in U.S. Appl. No. 15/088,436.
Aug. 29, 2016 Office Action issued in Chinese Patent Application No. 201380005298.9.
Dec. 29, 2016 Office Action issued in Korean Patent Application No. 10-2014-7022562.
Feb. 21, 2017 Office Action issued in Japanese Patent Application No. 2016-118643.
Jan. 17, 2017 Notice of Allowance issued in U.S. Appl. No. 15/088,436.
Oct. 6, 2017 Office Action issued in U.S. Appl. No. 15/485,596.
Jan. 16, 2018 Office Action issued in European Patent Application No. 13735697.8.
Mar. 29, 2018 Office Action issued in Korean Patent Application No. 10-2017-7017747.
Mar. 26, 2018 Office Action issued in Indian Patent Application No. 6020/DELNP/2014.

(56) References Cited

OTHER PUBLICATIONS

Jul. 3, 2018 Office Action issued in U.S. Appl. No. 15/485,596.
Jan. 2, 2019 Office Action issued in U.S. Appl. No. 15/485,596.
Nov. 27, 2018 Office Action issued in Japanese Patent Application No. 2017-186295.
Jun. 13, 2019 Office Action issued in U.S. Appl. No. 15/485,596.
Feb. 27, 2020 Office Action issued in Brazilian Patent Application No. BR112014016988-8.
Jan. 2, 2020 Notice of Allowance issued in U.S. Appl. No. 15/485,596.
Jan. 5, 2021 Office Action issued in Japanese Patent Application No. 2019-229700.
Jun. 24, 2021 U.S. Office Action issued U.S. Appl. No. 16/841,983.
Apr. 18, 2022 Office Action Issued in U.S. Appl. No. 16/841,983.
Oct. 24, 2022 Notice of Allowance issued in U.S. Appl. No. 16/841,983.
Sep. 26, 2023 Office Action issued in Indian Patent Application No. 6020/DELNP/2014.

\* cited by examiner

SOLID-STATE IMAGING DEVICE AND ELECTRONIC CAMERA

CROSS REFERENCE TO RELATED APPLICATION

This application is a continuation of U.S. application Ser. No. 16/841,983 filed Apr. 7, 2020, which is a continuation of U.S. application Ser. No. 15/485,596 filed Apr. 12, 2017 (now U.S. Pat. No. 10,674,102), which is a continuation of U.S. application Ser. No. 15/088,436 filed Apr. 1, 2016 (now U.S. Pat. No. 9,654,709), which is a continuation of U.S. application Ser. No. 13/736,204 filed Jan. 8, 2013 (now U.S. Pat. No. 9,385,148), which is based on and claims priority under 35 U.S.C. 119 from Japanese Patent Application No. 2012-005270 filed on Jan. 13, 2012. The disclosures of the prior applications are hereby incorporated by reference herein in their entireties.

BACKGROUND

1. Field

The present application relates to a solid-state imaging device and an electronic camera.

2. Description of the Related Art

Conventionally, a contrast method, a phase-difference AF method, and the like are known as the technique for realizing high-speed AF (auto-focusing) by using an electronic camera. The contrast method is a method for detecting a focusing position by using a pixel for imaging. Furthermore, the phase-difference AF method requires a dedicated pixel for focus detection, and for example, there is known a technique for arranging the pixel for focus detection at some of the pixels for imaging of one image sensor (e.g., see Japanese Unexamined Patent Application Publication No. 2007-282109). Moreover, there is known a technique using a dedicated image sensor for focus detection that is arranged separately from an image sensor for imaging (e.g., see Japanese Unexamined Patent Application Publication No. 2007-011070). In contrast, there is known a technique for stacking two photoelectric conversion elements in layers (e.g., see Japanese Unexamined Patent Application Publication No. 2009-130239).

However, when the pixel for focus detection is arranged at some of the pixels for imaging of an image sensor, a spurious signal of a vertical stripe or a horizontal stripe is apt to be generated, resulting in a problem in which sophisticated pixel interpolation processing is required. Furthermore, when the dedicated image sensor for focus detection is used, there is a problem in which a complicated optical system for dividing incoming light into the one for an image sensor for imaging and the one for an image sensor for focus detection is required. Moreover, the technique for stacking elements in layers is specific to image capturing, and neither focus detection nor efficient color array is contemplated.

SUMMARY

A solid-state imaging device according to the present embodiment includes a second image sensor having an organic photoelectric conversion film transmitting a specific light, and a first image sensor which is stacked in layers on a same semiconductor substrate as that of the second image sensor and which receives the specific light having transmitted the second image sensor, in which a pixel for focus detection is provided in the second image sensor or the first image sensor.

In particular, the second image sensor is arranged in a specific color array as a color filter of the first image sensor.

In addition, a color component of an image signal photoelectrically converted by the second image sensor and a color component of an image signal photoelectrically converted by the first image sensor are in a complementary color relationship.

Furthermore, a light-receiving surface of the second image sensor and a light-receiving surface of the first image sensor are arranged on a same optical path.

Moreover, the pixel for focus detection is uniformly arranged at all pixels of the second image sensor or the first image sensor.

In addition, the pixel for focus detection includes a photoelectric conversion part which receives at least one of light beams being obtained by dividing incoming light on each pixel by a pupil-division.

An electronic camera according to the present embodiment is an electronic camera mounting the solid-state imaging device, in which there are provided an optical system which projects incoming light from an object on the second image sensor and the first image sensor being arranged on a same optical path, an imaging part which performs focus control of the optical system by using a focus detection signal output from the second image sensor and which captures an object image by using an image signal output from the first image sensor, and a recording part which records the object image onto a storage medium.

Furthermore, error correction of a focus detection signal output from a pixel of a different color component of the second image sensor is performed.

Moreover, the imaging part performs focus detection by using a phase difference detection method after inputting a focus detection signal, which corresponds to an image being obtained by dividing incoming light on the pixel for focus detection by a pupil-division, from the pixel for focus detection.

According to the present embodiment, an AF method can be realized independently of a pixel for imaging without using sophisticated pixel interpolation processing and a complicated optical system.

DETAILED DESCRIPTION OF THE EMBODIMENTS

Hereinafter, embodiments of a solid-state imaging device and an electronic camera according to the present invention will be described in detail with reference to the accompanying drawings.

Figure 1:
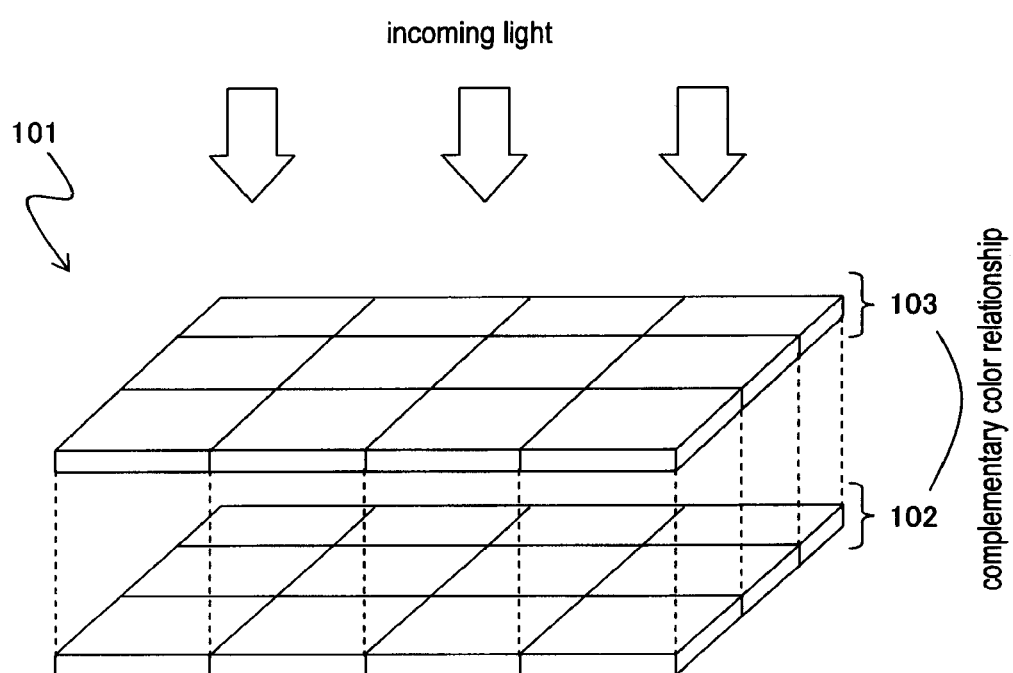
FIG. 1 is a view showing an overview of a solid-state image sensor 101.

FIG. 1 is a view showing an overview of a solid-state image sensor 101 according to the present embodiment. In FIG. 1, the solid-state image sensor 101 includes a first image sensor 102 that performs photoelectric conversion by using a photodiode, as with an ordinary solid-state image sensor, and a second image sensor 103 arranged on the same optical path on an incoming light side of the first image sensor 102. The second image sensor 103 includes an organic photoelectric conversion film which transmits specific light and photoelectrically converts non-transmitted light, and the specific light having transmitted the second image sensor 103 is received by the first image sensor 102. Here, the first image sensor 102 and the second image sensor 103 are formed on the same semiconductor substrate, and each pixel position is in one-to-one correspondence to each other. For example, the first row and first column pixel of the first image sensor 102 corresponds to the first row and first column pixel of the second image sensor 103.

Figure 2:
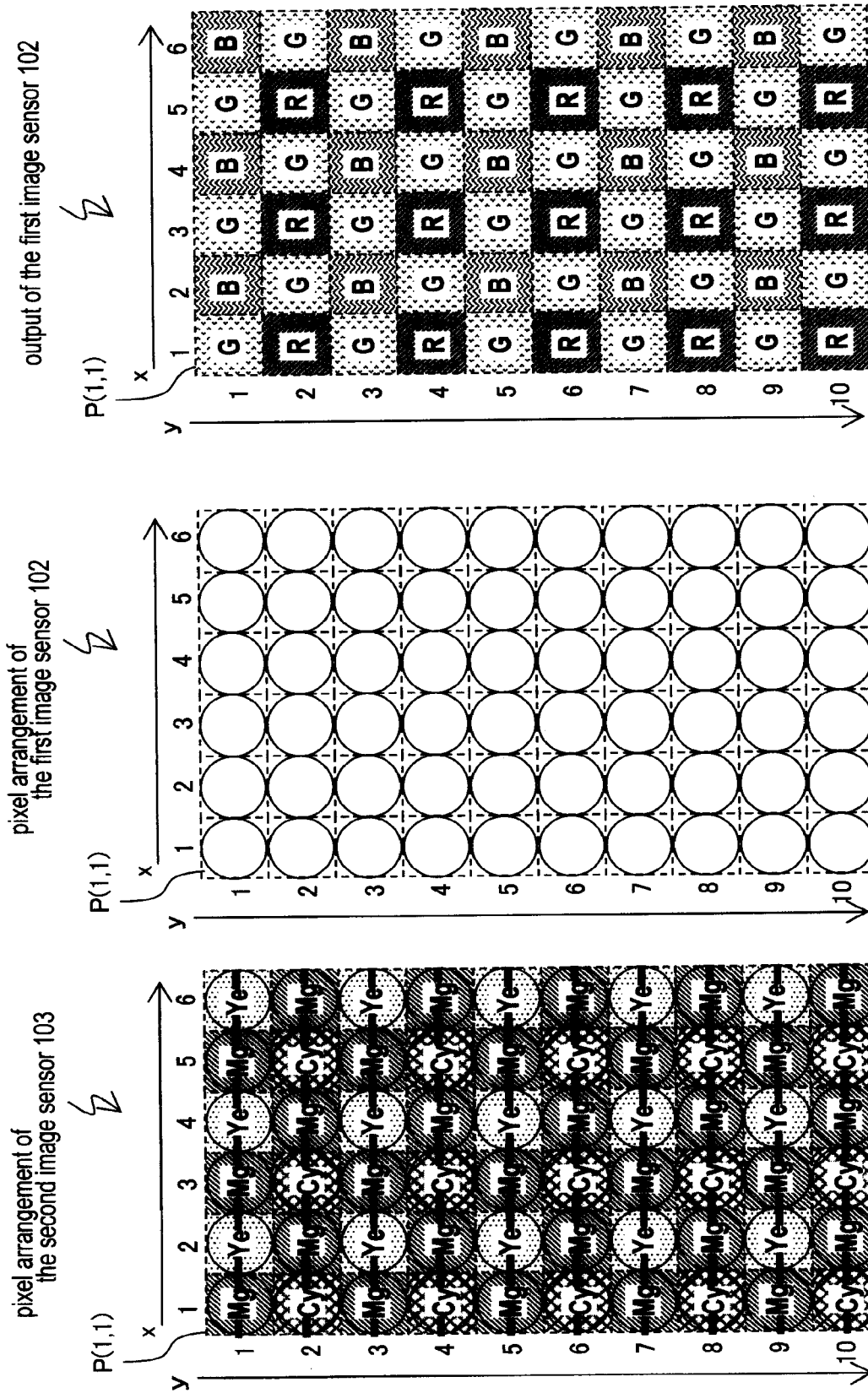
FIG. 2A is a view showing an example of pixel arrangement.
FIG. 2B is a view showing an example of pixel arrangement.
FIG. 2C is a view showing an example of pixel arrangement.

FIG. 2A is a view showing an example of the pixel arrangement of the second image sensor 103. In FIG. 2A, the horizontal direction is set to an x-axis and the vertical direction is set to a y-axis, and the coordinate of a pixel P is denoted as P(x, y). In an example of the second image sensor 103 of FIG. 2A, for each pixel of an odd row, an organic photoelectric conversion film is alternatively arranged which photoelectrically converts the light of Mg (magenta) and Ye (yellow), while for each pixel of an even row, an organic photoelectric conversion film is alternatively arranged which photoelectrically converts the light of Cy (cyan) and Mg (magenta). Then, the light that is not received by each pixel is transmitted therethrough. For example, a pixel P(1, 1) photoelectrically converts the light of Mg and transmits the light of the complementary color (G: green) of Mg. Similarly, a pixel P(2, 1) photoelectrically converts the light of Ye and transmits the light of the complementary color (B: blue) of Ye, and a pixel P(1, 2) photoelectrically converts the light of Cy and transmits the light of the complementary color (R: red) of Cy. Note that, although the detail will be described later, each pixel of the second image sensor 103 includes a pixel for focus detection serving as a pair corresponding to a phase-difference AF method.

FIG. 2B is a view showing an example of the pixel arrangement of the first image sensor 102. Note that, each pixel position of FIG. 2B is the same as that of FIG. 2A. For example, a pixel (1, 1) of the second image sensor 103 corresponds to the pixel (1, 1) of the first image sensor 102. In FIG. 2B, the first image sensor 102 is not provided with a color filter or the like, and photoelectrically converts the specific light transmitting the second image sensor 103 (the complementary color of light that is absorbed and photoelectrically converted by the organic photoelectric conversion film). Accordingly, as shown in FIG. 2C, by the first image sensor 102, an image of the color components of G (green) and B (blue) is obtained for each pixel of an odd row, and an image of the color components of R (red) and G (green) is obtained for each pixel of an even row. For example, in the pixel P(1, 1), an image of the G component of the complementary color of Mg of the second image sensor 103 is obtained. Similarly, in a pixel P(2, 1) and in a pixel P(1, 2), an image of the B component of the complementary color of Ye and an image of the R component of the complementary color of Cy are obtained, respectively.

In this manner, in the solid-state image sensor 101 according to the present embodiment, the second image sensor 103 including an organic photoelectric conversion film plays the role of the conventional color filter, and a complementary color image of the second image sensor 103 can be obtained by the first image sensor 102. In the examples of FIGS. 2A to 2C, an image with a Bayer array is obtained from the first image sensor 102. Note that, FIGS. 2A to 2C show examples of the Bayer array, but even with other array, the same results can be achieved by arranging the first image sensor 102 and the second image sensor 103 so that each pixel of the former and each pixel of the latter have a complementary color relationship.

In particular, in the solid-state image sensor 101 according to the present embodiment, since an organic photoelectric conversion film is used instead of a color filter required for the conventional single plate type image sensor, the incoming light, which would have been otherwise absorbed by the color filter, can be effectively utilized by the second image sensor 103.

Furthermore, in the solid-state image sensor 101 according to the present embodiment, since a pixel for imaging is arranged in the first image sensor 102 and a pixel for focus detection is uniformly arranged overall in the second image sensor 103, there is no need to perform the complicated pixel interpolation processing, unlike the conventional art of arranging a pixel for focus detection at some of the pixels for imaging, and thus a signal for focus detection and a color image signal can be obtained from the second image sensor 103 and the first image sensor 102, respectively independently.

Figure 3:
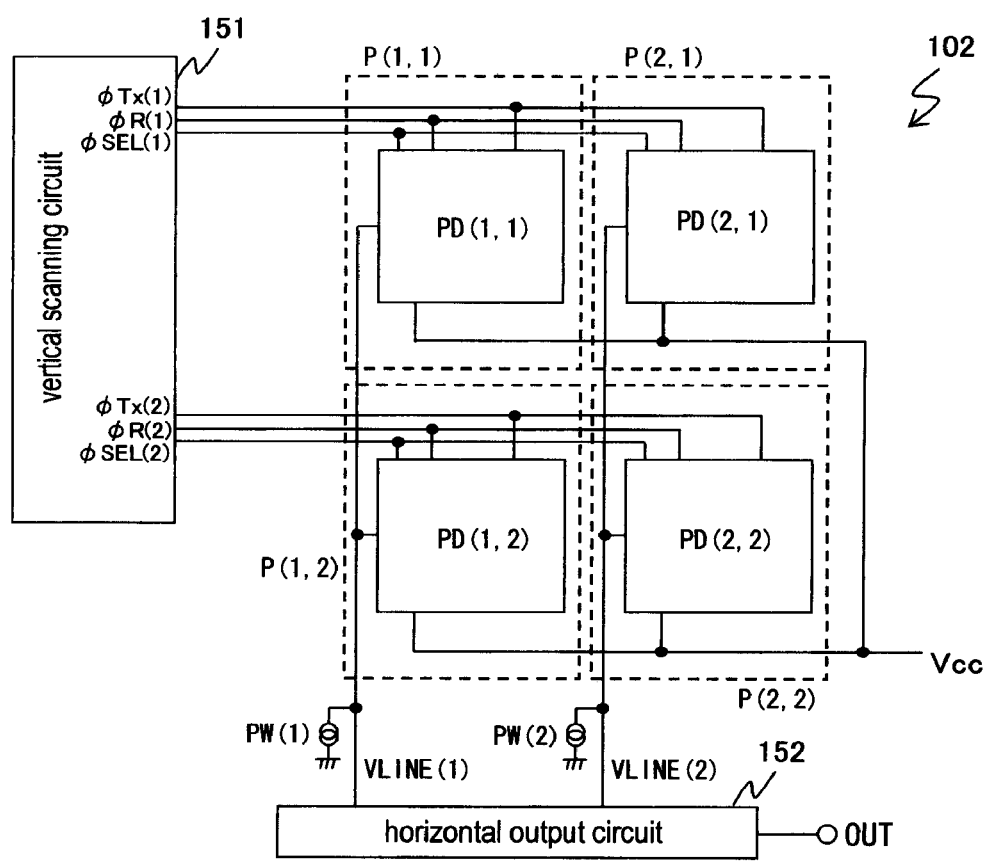
FIG. 3 is a view showing a circuit example of a first image sensor 102.

FIG. 3 is a view showing a circuit example of the first image sensor 102. In FIG. 3, the first image sensor 102 has the pixel P(x, y) arranged in two dimensions, a vertical scanning circuit 151, a horizontal output circuit 152, and an electric current source PW. Note that, in the example of FIG. 3, for ease of understanding, a configuration of 4 pixels of 2 rows by 2 columns is shown, but is not limiting, and actually a large number of pixels are arranged in two dimensions.

In FIG. 3, the vertical scanning circuit 151 outputs timing signals (φTx(y), φR(y), φSEL(y)) for reading a signal from each pixel. For example, timing signals φTx(1), φR(1), and φSEL(1) are supplied to the pixels P(1, 1) and P(2, 1) of the first row. Then, a signal is read from each pixel of vertical signal lines VLINE(1) and VLINE(2) connected to electric current sources PW(1) and PW(2) arranged in each column, respectively, and is temporarily held in the horizontal output circuit 152. Then, the signal of each pixel temporarily held in the horizontal output circuit 152 for each row is sequentially output to the outside (as an output signal Vout). Note that, although not illustrated in FIG. 3, when a signal is read from each pixel to the horizontal output circuit 152 via the vertical signal line VLINE(x), a correlated double sampling (CDS circuit) for removing a variation in the signal between pixels, an AD conversion circuit, a digital signal processing circuit, and the like may be arranged.

Figure 4:
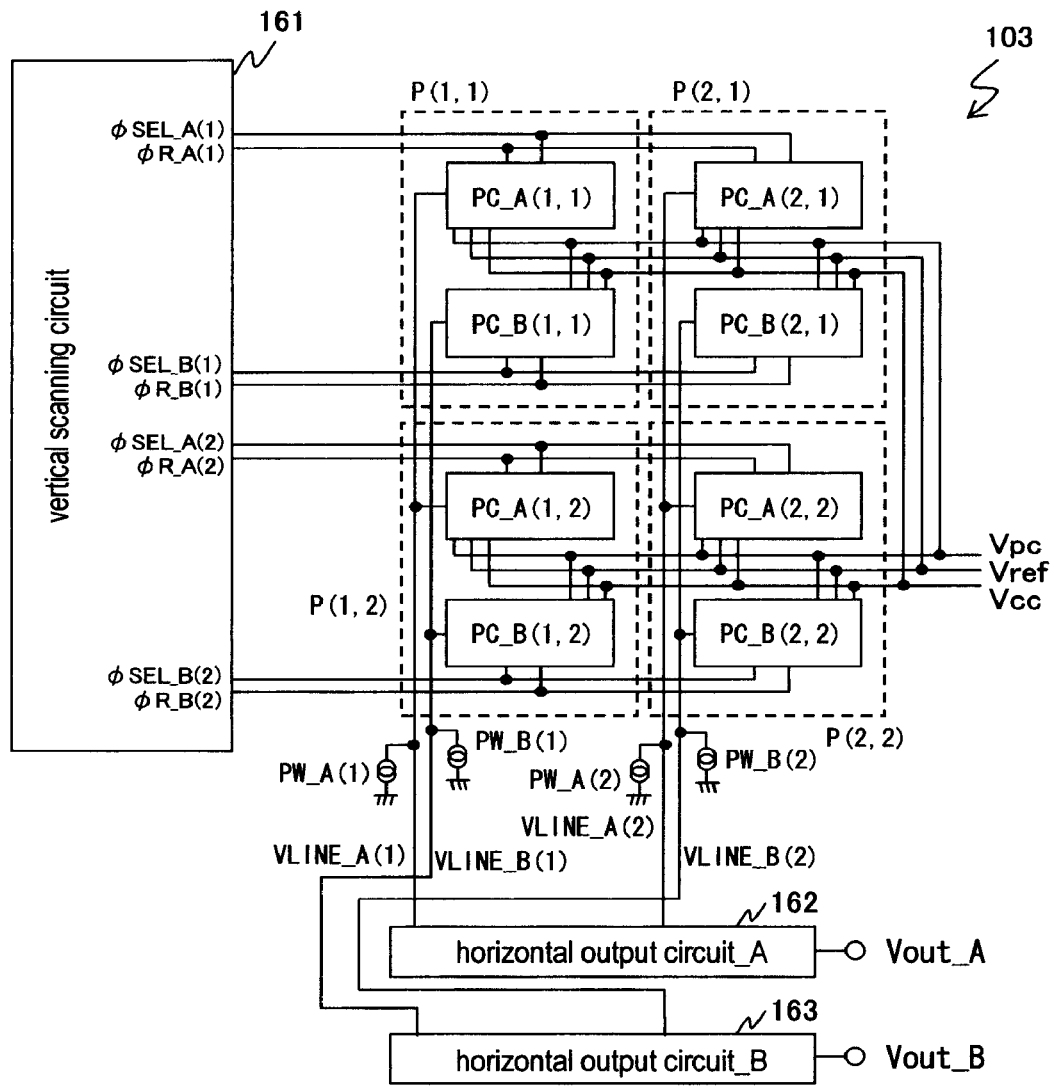
FIG. 4 is a view showing a circuit example of a second image sensor 103.

FIG. 4 is a view showing a circuit example of the second image sensor 103. In FIG. 4, the second image sensor 103 has the pixel P(x, y) arranged in two dimensions, a vertical scanning circuit 161, a horizontal output circuit 162, a horizontal output circuit 163, an electric current source PW_A, and an electric current source PW_B. Note that, in the example of FIG. 4, as with FIG. 3, the second image sensor 103 includes 4 pixels of 2 rows by 2 columns, but not limited thereto, and actually a large number of pixels are arranged in two dimensions. Furthermore, each pixel P(x, y) of FIG. 4 corresponds to each pixel P(x, y) of FIG. 3. In particular, the second image sensor 103 has, at one pixel position, two photoelectric conversion parts of a light-receiving part PC_A(x, y) and a light-receiving part PC_B (x, y) each including an organic photoelectric conversion film, and constitutes a pair of pixels serving as a pair of the phase-difference AF method.

In FIG. 4, the vertical scanning circuit 161 outputs timing signals (φR_A(y), φR_B(y), φSEL_A(y), and φSEL_B(y)) for reading a signal from each pixel. For example, timing signals φR_A(1) and φSEL_A(1) are supplied to the light-receiving parts PC_A(1, 1) and P_A(2, 1) of the first row, and timing signals φR_B(1) and φSEL_B(1) are supplied to the light-receiving parts PC_B(1, 1) and P_B(2, 1). Then, the signals of the light-receiving parts PC_A(1, 1) and P_A(2, 1) are read out to vertical signal lines VLINE_A(1) and VLINE_A(2) that are connected to the electric current sources PW_A(1) and PW_A(2) arranged at each column, respectively, and are temporarily held in a horizontal output circuit_A162. The signal of each pixel temporarily held in the horizontal output circuit_A162 for each row is sequentially output to the outside (as an output signal Vout_A). Similarly, the signals of the light-receiving parts PC_B(1, 1) and P_B(2, 1) are read out to the vertical signal lines VLINE_B(1) and VLINE_B(2) that are connected to the electric current sources PW_B(1) and PW_B(2) arranged at each column, respectively, and are temporarily held in a horizontal output circuit_B162. The signal of each pixel temporarily held in the horizontal output circuit_B162 for each row is sequentially output to the outside (as an output signal Vout_B).

In the foregoing, the circuit examples of the first image sensor 102 and the second image sensor 103 have been described in FIG. 3 and FIG. 4, respectively separately, but actually the first image sensor 102 and the second image sensor 103 are formed on the same semiconductor substrate and constitute one solid-state image sensor 101.

Circuit Example of the Pixel of the Solid-State Image Sensor 101

Figure 5:
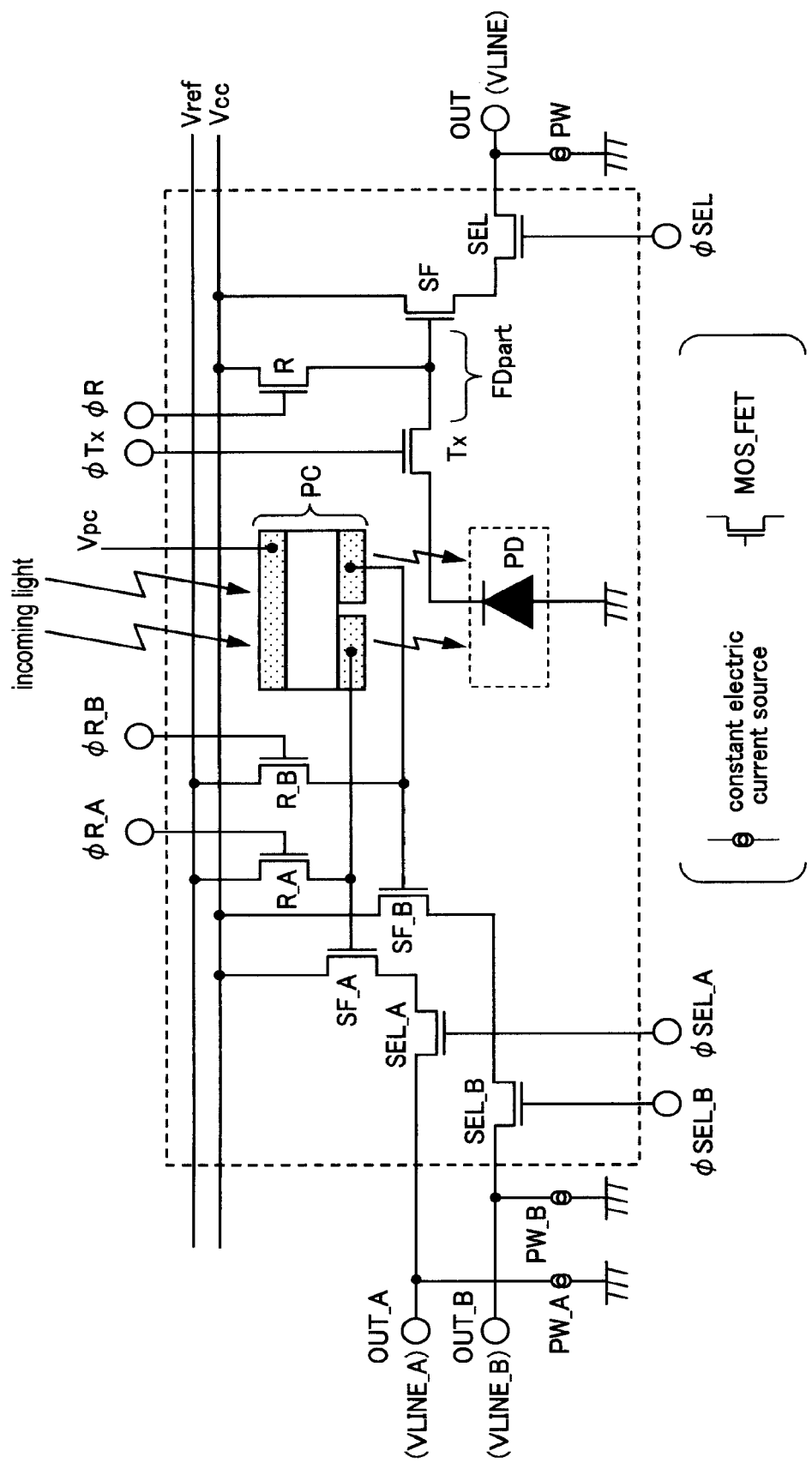
FIG. 5 is a view showing a circuit example of a pixel.

Next, a circuit example of the pixel of the solid-state image sensor 101 will be described. FIG. 5 is a view showing a circuit example of one pixel P(x, y) arranged in two dimensions. In FIG. 5, the pixel P(x, y) has a photodiode PD, a transfer transistor Tx, a reset transistor R, an output transistor SF, and a selection transistor SEL as a circuit for constituting the first image sensor 102. The photodiode PD stores a charge corresponding to the amount of light of incoming light, and the transfer transistor Tx transfers the charge stored in the photodiode PD to a floating diffusion region (FD part) on the output transistor SF side. The output transistor SF constitutes the electric current source PW and a source follower via the selection transistor SEL, and outputs, to the vertical signal line VLINE, an electric signal corresponding to the charge stored in the FD part as an output signal OUT. Note that the reset transistor R resets the charge of the FD part to a power-supply voltage Vcc.

Furthermore, the circuit for constituting the second image sensor 103 has a light-receiving part PC including an organic photoelectric conversion film, reset transistors R_A and R_B, output transistors SF_A and SF_B, and selection transistors SEL_A and SEL_B. The light-receiving part PC including an organic photoelectric conversion film converts non-transmitted light into an electric signal corresponding to the amount of the non-transmitted light, as described in FIG. 2A, and outputs the resulting signal to the vertical signal lines VLINE_A and VLINE_B as output signals OUT_A and OUT_B via the output transistors SF_A and SF_B that constitute a source follower with the electric current sources PW_A and PW_B via the selection transistors SEL_A and SEL_B, respectively. Note that the reset transistors R_A and R_B reset the output signal of the light-receiving part PC to a reference voltage Vref. Furthermore, a high voltage Vpc is supplied for operation of the organic photoelectric conversion film. Here, each transistor includes a MOS_FET.

Figure 6A:
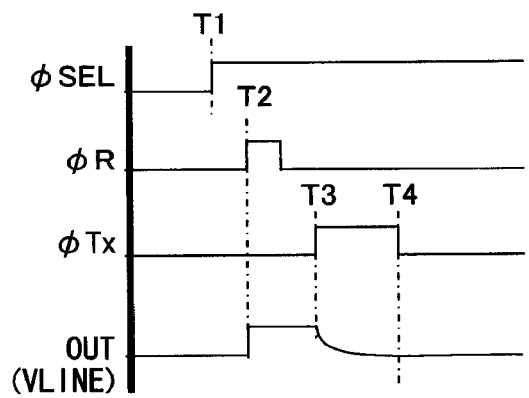
FIG. 6A is a view showing an example of a timing chart.
Figure 6B:
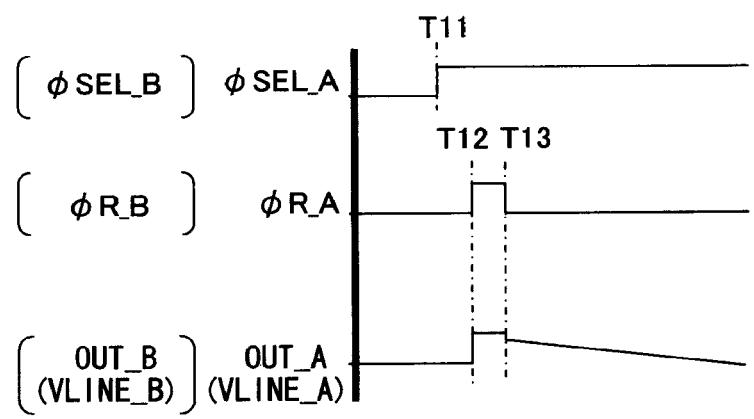
FIG. 6B is a view showing an example of a timing chart.

Here, the operation of the circuit of FIG. 5 is described using timing charts of FIGS. 6A and 6B. FIGS. 6A and 6B are views showing an example of the timing signal of FIG. 5. FIG. 6A is a view showing an operation timing of the first image sensor 102, in which, first, a selection signal φSEL becomes "High" at a timing T1 and the selection transistor SEL is turned on. Next, a reset signal φR becomes "High" at a timing T2, and the FD part is reset to the power-supply voltage Vcc and the output signal OUT also becomes a reset level. Then, after the reset signal φR becomes "Low", the transfer signal φTx becomes "High" at a timing T3, and the charge stored in the photodiode PD is transferred to the FD part, and the output signal OUT starts to change in response to the charge amount and is then stabilized. Then, the transfer signal φTx becomes "Low", and the signal level of the output signal OUT to be read from a pixel to the vertical signal line VLINE is established. Then, the output signal OUT of each pixel read out to the vertical signal line VLINE is temporarily held in the horizontal output circuit_152 for each row, and, after that, is output from the solid-state image sensor 101 as the output signal Vout. In this manner, a signal is read from each pixel of the first image sensor 102.

FIG. 6B is a view showing an operation timing of the second image sensor 103, wherein first, the selection signal φSEL_A (or φSEL_B) becomes "High" at a timing T11, and the selection transistor SEL_A (or SEL_B) is turned on. Next, the reset signal φR_A (or φR_B) becomes "High" at a timing T12, and the output signal OUT_A (or φOUT_B) is also set to the reset level. Then, immediately after the reset signal φR_A (or φR_B) becomes "Low" at a timing T13, the charge accumulation of the light-receiving part PC by an organic photoelectric conversion film is started, and the output signal OUT_A (or output signal OUT_B) changes in response to the charge amount. Then, the resulting output signal OUT_A (or output signal OUT_B) is temporarily held in the horizontal output circuit_A162 (or horizontal output circuit_B163) for each row, and is then output from the solid-state image sensor 101 as the output signal Vout_A (or output signal Vout_B). In this manner, a signal is read from each pixel of the second image sensor 103.

Figure 7:
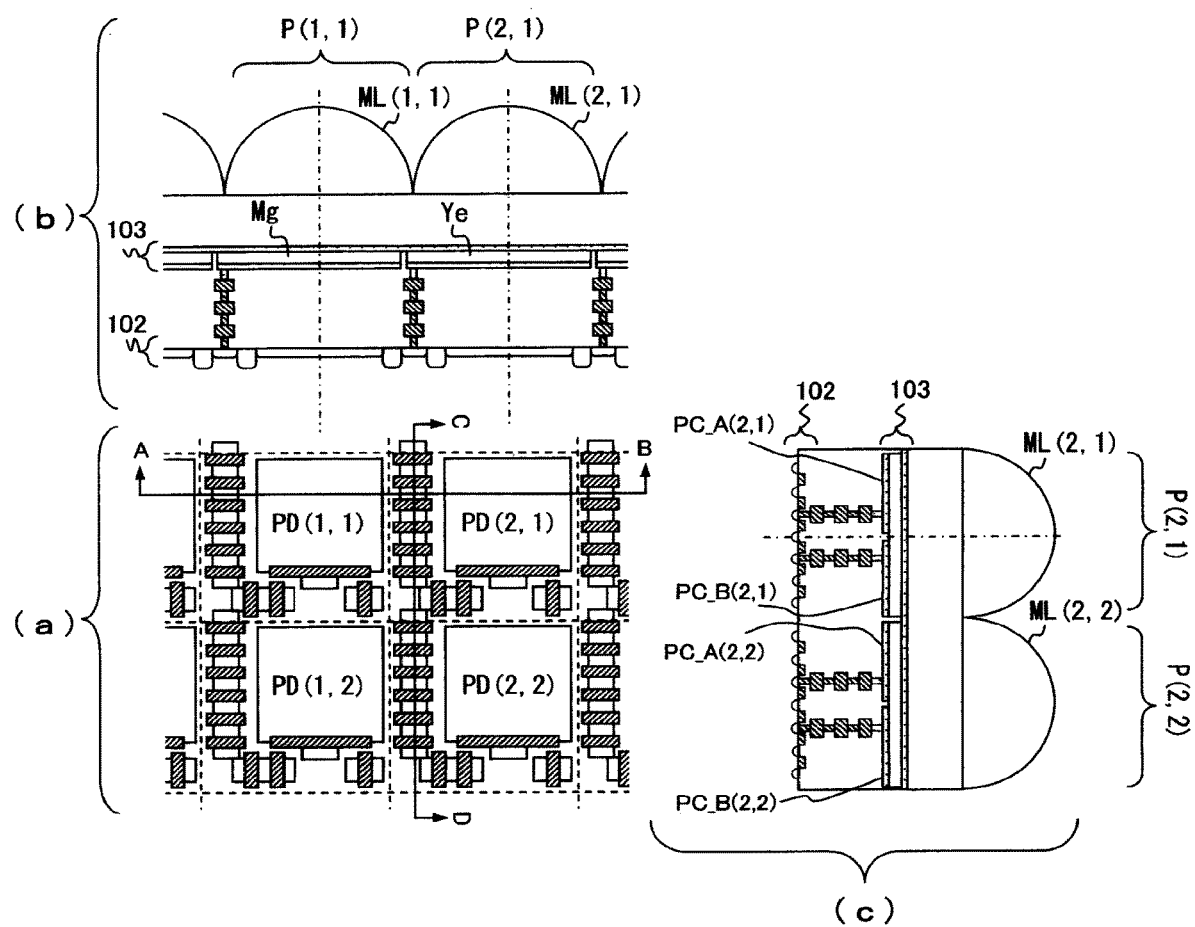
FIG. 7 is a view showing a relationship between a layout configuration and a layout cross-section.

A portion (a) of FIG. 7 is an example of the semiconductor layout of the solid-state image sensor 101. Note that the portion (a) of FIG. 7 corresponds to each of the pixel P(1, 1) to the pixel P(2, 2) of FIGS. 2A to 2C and FIG. 4 described earlier.

Figure 8A:
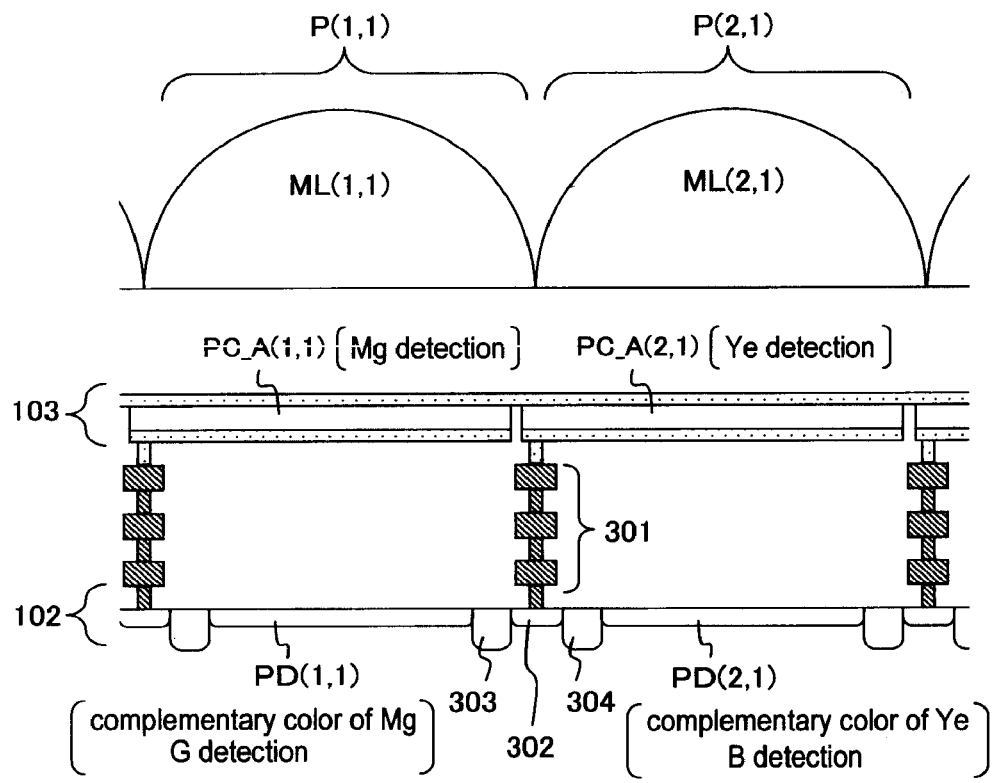
FIG. 8A is a view showing a cross-section A-B.
Figure 8B:
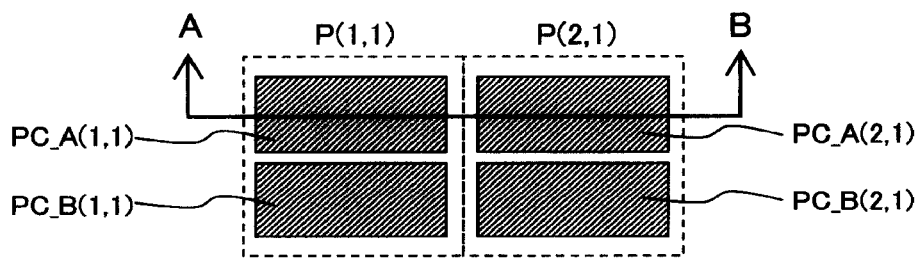
FIG. 8B is a view showing the cross-section A-B.

A portion (b) of FIG. 7 is a cross-sectional view of the portion (a) of FIG. 7 along a cutout line A-B in the horizontal direction on the pixel P(1, 1) and the pixel P(2, 1). Furthermore, FIG. 8A is an enlarged view of the portion (b) of FIG. 7, and FIG. 8B is a view illustrating the pixel positions along the cutout line A-B for ease of understanding. The pixel P(1, 1) at the same position of the first image sensor 102 and the second image sensor 103 receives incoming light from an object input from a same micro lens ML(1, 1). Here, in FIG. 8A, a wiring layer 301 has a three-layer structure, but it may have a two-layer structure or may have a four or more layer structure. Then, the output signal of the second image sensor 103 is extracted from a signal output end 302 via the wiring layer 301. Note that, on both sides of the signal output end 302, there are arranged separation layers 303 and 304. Moreover, at a distance from the separation layers 303 and 304, there are arranged photodiodes PD(1, 1) and PD(2, 1).

Figure 9A:
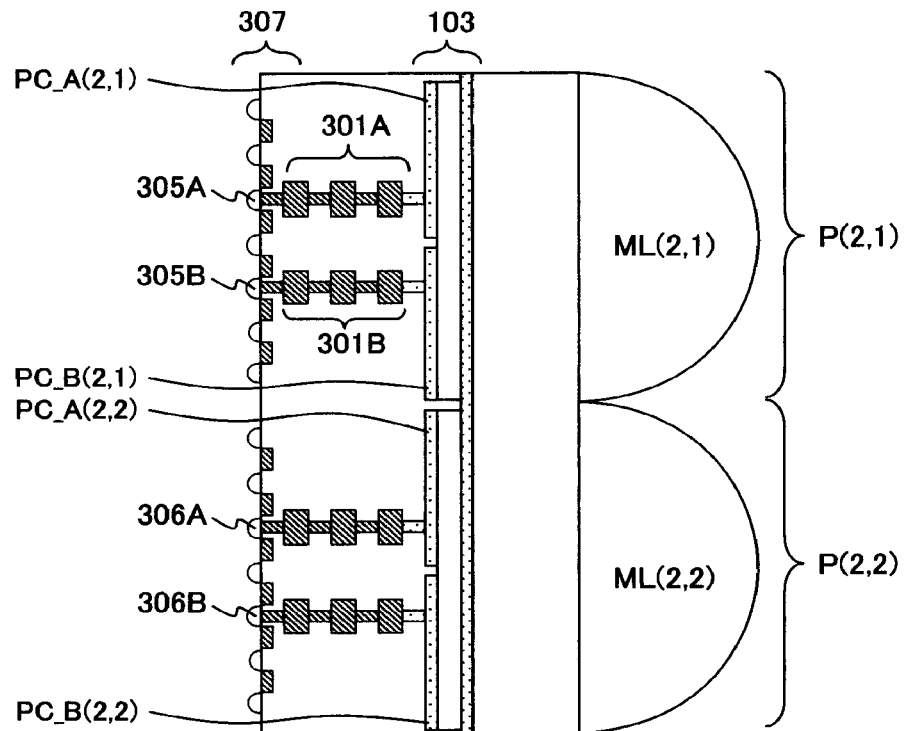
FIG. 9A is a view showing a cross-section C-D.
Figure 9B:
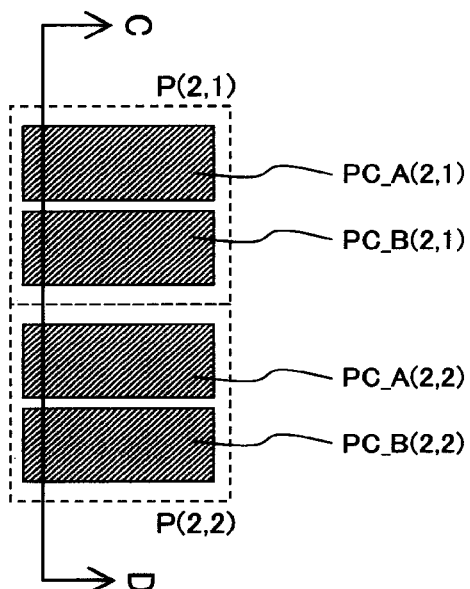
FIG. 9B is a view showing the cross-section C-D.

A portion (c) of FIG. 7 is a cross-sectional view of the portion (a) of FIG. 7 along a cutout line C-D in the vertical direction on the pixel P(2, 1) and the pixel P(2, 2). Furthermore, FIG. 9A is an enlarged view of the portion (c) of FIG. 7, and FIG. 9B is a view illustrating the pixel positions along the cutout line C-D for ease of understanding. The pixel P(2, 1) and pixel P(2, 2) at the same positions of the first image sensor 102 and the second image sensor 103 receive incoming light from an object input from the same micro lenses ML(2, 1) and ML(2, 2), respectively. Here, FIG. 9B differs from FIG. 8B in that in the pixel P(2, 1) of the second image sensor 103, the light-receiving part is pupil-divided into the light-receiving part PC_A(2, 1) and the light-receiving part PC_B(2, 1), and in that in the pixel P(2, 2), the light-receiving part is pupil-divided into the light-receiving part PC_A(2, 2) and the light-receiving part PC_B(2, 2). Then, the light-receiving part PC_A(2, 1) and the light-receiving part PC_B(2, 1) can receive an image, serving as a pair, at a pupil position of the optical system, respectively, and perform focus detection by using a phase-difference AF method. Similarly, the light-receiving part PC_A(2, 2) and the light-receiving part PC_B(2, 2) receive an image, serving as a pair, at the pupil position of the optical system, respectively. Note that, since the phase-difference AF method is a well-known technique, the detailed description thereof is omitted.

Here, in FIG. 9A, the wiring layer 301 of FIG. 8A corresponds to a wiring layer 301A and a wiring layer 301B. The wiring layer 301A outputs a signal of the light-receiving part PC_A(2, 1) of an organic photoelectric conversion film to the signal output end 305A, and the wiring layer 301B outputs a signal of the light-receiving part PC_B(2, 1) of an organic photoelectric conversion film to the signal output end 305B. In the wiring layer 301 of FIG. 8A, only one wiring layer is visible because the wiring layer 301A and the wiring layer 301B overlap with each other. Similarly, a signal of the light-receiving part PC_A(2, 2) of an organic photoelectric conversion film of the pixel P(2, 2) is output to a signal output end 306A, and a signal of the light-receiving part PC_B(2, 2) is output to a signal output end 306B. Then, in a readout circuit 307, readout circuits such as an output transistor, a selection transistor, a reset transistor, and the like are arranged, in which the signal of each pixel is output to the outside from the solid-state image sensor 101.

Figure 10:
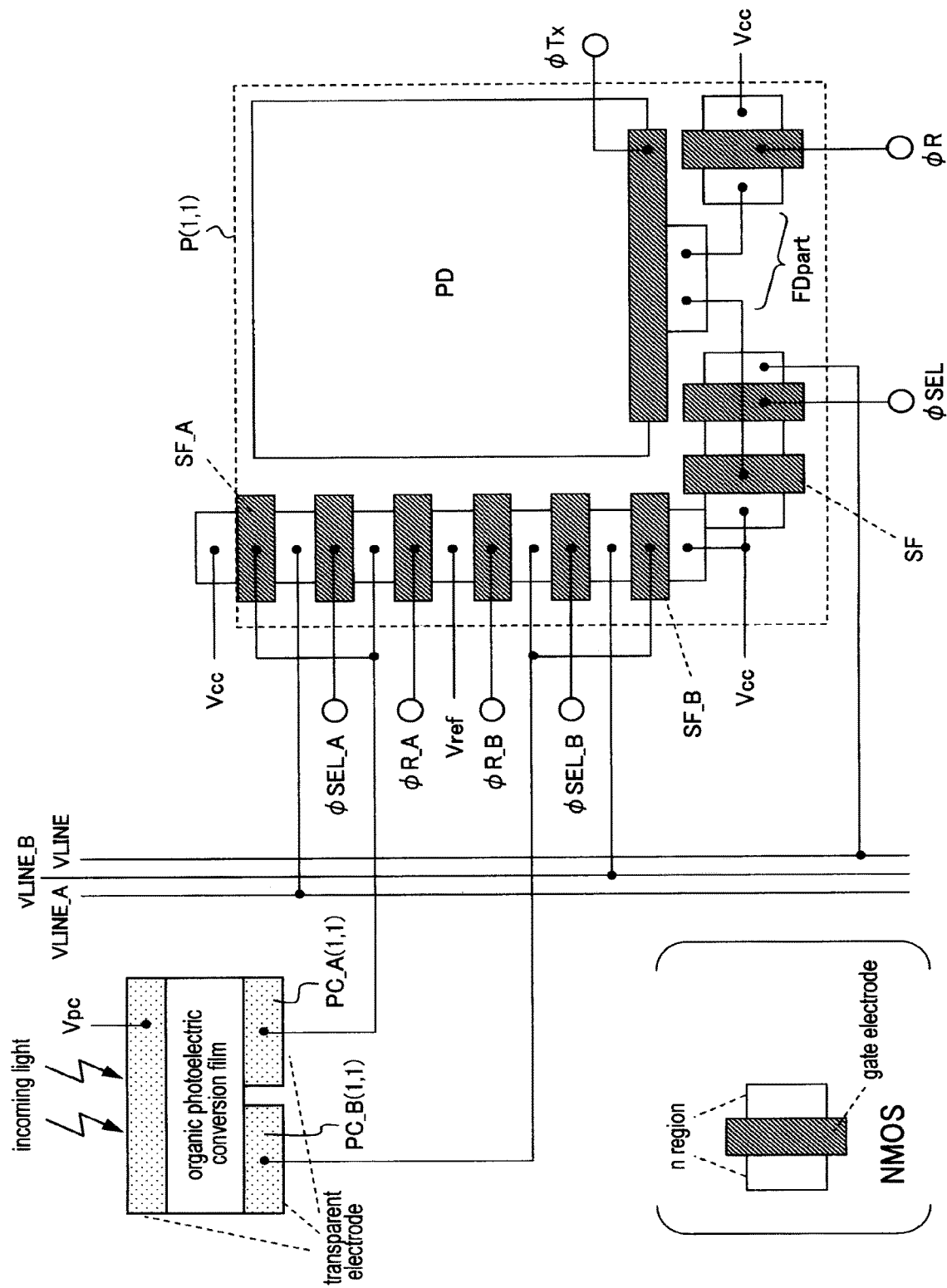
FIG. 10 is a view showing a layout configuration.

FIG. 10 is an enlarged view of the layout drawing of the pixel P(1, 1) of the portion (a) of FIG. 7. In FIG. 10, for the circuit arranged around the photodiode PD, a hatched portion indicates a gate electrode, and white portions on both sides of the gate electrode indicate an NMOS type transistor including an n region. In FIG. 10, the charge stored in the photodiode PD of the first image sensor 102 is transferred to the FD part when the transfer signal φTx is supplied to the gate electrode of the transfer transistor. The FD part is connected to the gate electrode of the output transistor SF, in which the transferred charge is converted into an electric signal, and when the selection signal SEL is supplied to the gate electrode of the selection transistor SEL, the converted electric signal is read out to the vertical signal line VLINE. Note that, when the reset signal φR is supplied to the gate electrode of the reset transistor R, the charge of the FD part is reset to the power-supply voltage Vcc.

In contrast, in FIG. 10, an electric signal output from a transparent electrode of the light-receiving part PC_A(1, 1) of an organic photoelectric conversion film is connected to the gate electrode of the output transistor SF_A, and when the selection signal φSEL_A is supplied to the gate electrode of the selection transistor SEL_A, the electric signal is read out to the vertical signal line VLINE_A. Similarly, an electric signal output from the transparent electrode of the light-receiving part PC_B(1, 1) is connected to the gate electrode of the output transistor SF_B, and when the selection signal φSEL_B is supplied to the gate electrode of the selection transistor SEL_B, the electric signal is read out to the vertical signal line VLINE_B. Note that, when the reset signal φR_A (or φR_B) is supplied to the gate electrode of the reset transistor R_A (or R_B), the signal voltage of the light-receiving part PC_A(1, 1) (or PC_B(1, 1)) is reset to the reference voltage Vref. Note that, in the organic photoelectric conversion film, the high voltage Vpc for extracting an electric signal corresponding to an incoming light quantity from an opposing transparent electrode is supplied to a transparent electrode on an incoming light side.

As described above, the solid-state image sensor 101 according to the present embodiment has the first image sensor 102 performing photoelectric conversion by using a conventional photodiode and the second image sensor 103 performing photoelectric conversion by using an organic photoelectric conversion film, wherein a signal for imaging can be acquired from the first image sensor 102 and a signal for focus detection corresponding to a phase-difference AF method can be acquired from the second image sensor 103.

Therefore, in the solid-state image sensor 101, there is no need to arrange a pixel for focus detection at some of the pixels for imaging, unlike the conventional art, and there is no degradation in image quality due to a spurious signal of a vertical stripe or a horizontal stripe, and sophisticated pixel interpolation processing is not required. In addition, since the first image sensor 102 for imaging and the second image sensor 103 for focus detection are stacked in layers so as to use incoming light of the same micro lens, a complicated optical system for dividing the incoming light into the light for an image sensor for imaging and the light for an image sensor for focus detection is not required, unlike the conventional art. In particular, because the solid-state image sensor 101 according to the present embodiment does not require an optical device such as a prism or a mirror, while using two image sensors of the first image sensor 102 and the second image sensor 103, the arrangement and design of an optical system in configuring a camera are easy. Furthermore, in a dual-plate type imaging sensor using a prism, a mirror, and the like, adjustment and the like of the optical path length between two image sensors is indispensable, while in the solid-state image sensor 101 according to the present embodiment, the adjustment is not required because there is one optical path.

Moreover, the second image sensor 103 and the first image sensor 102 can detect color components having a complementary color relationship with each other, and the organic photoelectric conversion film of the second image sensor 103 can also be used as a color filter of the first image sensor 102, and incoming light can be efficiently used without being wasted.

In this manner, the solid-state image sensor 101 according to the present embodiment can realize a phase-difference AF method allowing for high-speed operation, without using sophisticated pixel interpolation processing and a complicated optical system. Here, in the embodiment, a phase-difference AF method capable of finding a focusing position at high speed is realized using the second image sensor 103, but a focusing position may be found by a contrast method through the use of the second image sensor 103. The contrast method is a method including the steps of: moving a focus lens while detecting the contrast of an image; and setting the position of a focus lens having the highest contrast, to a focusing position.

Figure 11A:
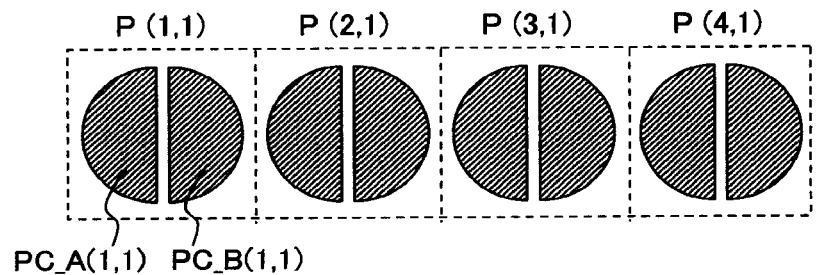
FIG. 11A is a view showing an example of the arrangement of a light-receiving part of the second image sensor 103.

Note that, when the contrast method is used, the contrast may be calculated by adding two light-receiving parts (e.g., PC_A(x, y) and PC_B(x, y) of FIG. 11A) provided in each pixel, or the light-receiving part of a pixel of the second image sensor 103 may be set to one light-receiving part without being divided.

In the above example, as shown in FIG. 11A, the light-receiving parts PC_A(x, y) and PC_B(x, y) serving as a pair corresponding to the phase-difference AF method are arranged in each pixel P(x, y) of the second image sensor 103. Then, both the two light-receiving parts of each pixel have been described as outputting a signal as a focus detection signal, but are not limited thereto. For example, two light-receiving parts of each pixel may be constructed so that a signal is output only from either one of light-receiving parts. In this case, light-receiving parts, where adjacent pixels are read, are light-receiving parts at mutually different positions of two light-receiving parts. In this manner, readout drive of a signal can be performed in a conventional manner.

Figure 11B:
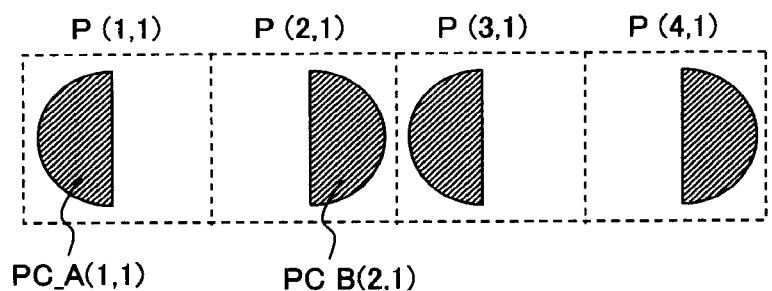
FIG. 11B is a view showing an example of the arrangement of the light-receiving part of the second image sensor 103.

Furthermore, as an alternative method, as shown in FIG. 11B, only a half of the light-receiving part PC_A(x, y) or the light-receiving part PC_B(x, y) may be arranged in one pixel P(x, y). That is, in FIG. 11B, AF control by the phase difference detection method can be performed, in which the pixel P(1, 1) having the light-receiving part PC_A(1, 1) arranged on the left side and the pixel P(2, 1) having the light-receiving part PC_B(2, 1) arranged on the right side are paired.

Figure 11C:
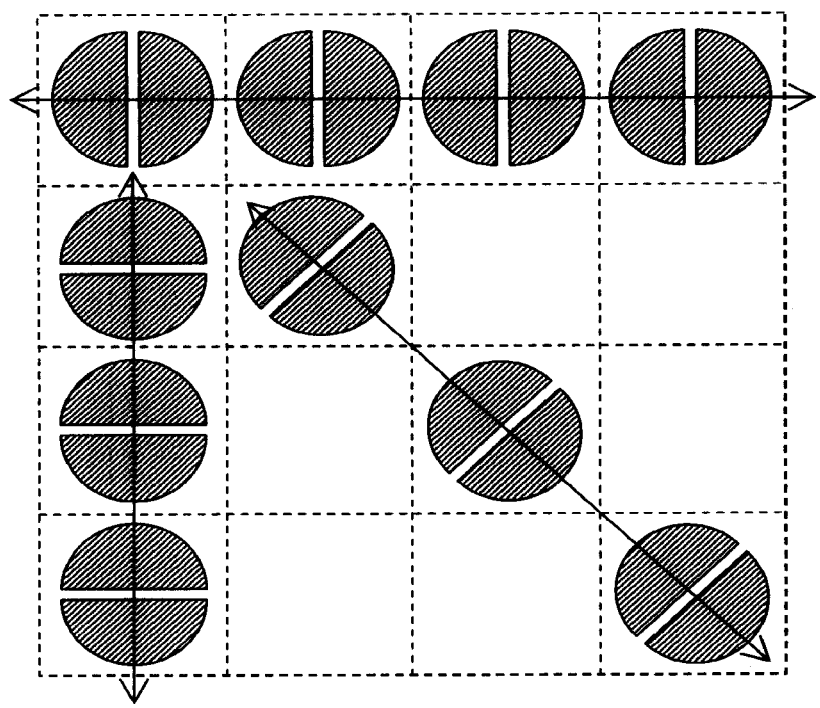
FIG. 11C is a view showing an example of the arrangement of the light-receiving part of the second image sensor 103.

Alternatively, as shown in FIG. 11C, the pixels for focus detection whose pupil division directions are various directions such as a vertical direction, a horizontal direction, and a diagonal direction, may exist mixedly. In each case, the solid-state image sensor 101 according to the present embodiment captures a signal for imaging by the first image sensor 102 and captures a signal for focus detection by the second image sensor 103, and thus focus detection by high-speed phase-difference AF can be performed at any position in a captured image without affecting the image quality of the captured image.

Here, in the second image sensor 103, as described in FIGS. 2A to 2C, since the pixels corresponding to three colors of Mg, Ye, and Cy exist mixedly, a signal for focus detection obtained from a pixel of a different color component might differ. Therefore, in performing focus detection, focus detection by the phase-difference AF method may be performed utilizing a signal for focus detection obtained from a pixel of the same color component. For example, in the case of FIG. 2A, only a signal for focus detection obtained from a pixel (a pixel of an odd number column in the case of an odd row, and a pixel of an even number column in the case of an even row) of Mg of a large number of pixels is used. Alternatively, an error between the pixels corresponding to three colors of Mg, Ye, and Cy (a variation in sensitivity between pixels, a variation (DC offset) in reference level, or the like) is measured in advance, and error correction may be made when performing phase-difference AF processing.

Furthermore, the output signal of the second image sensor 103 may be utilized not only for focus detection but also for white balance control.

(Modification 1)

Figure 12C:
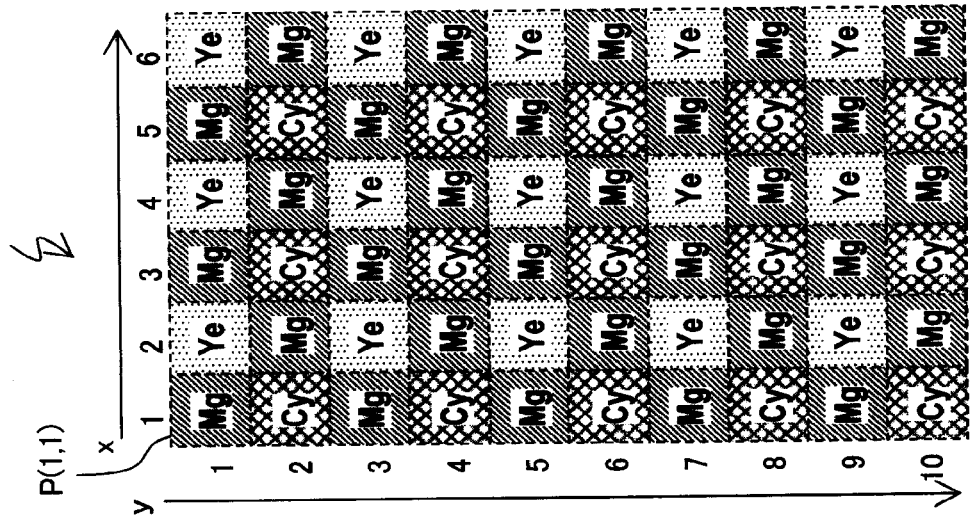
FIG. 12C is a view showing Modification 1 of the pixel arrangement.
Figure 12B:
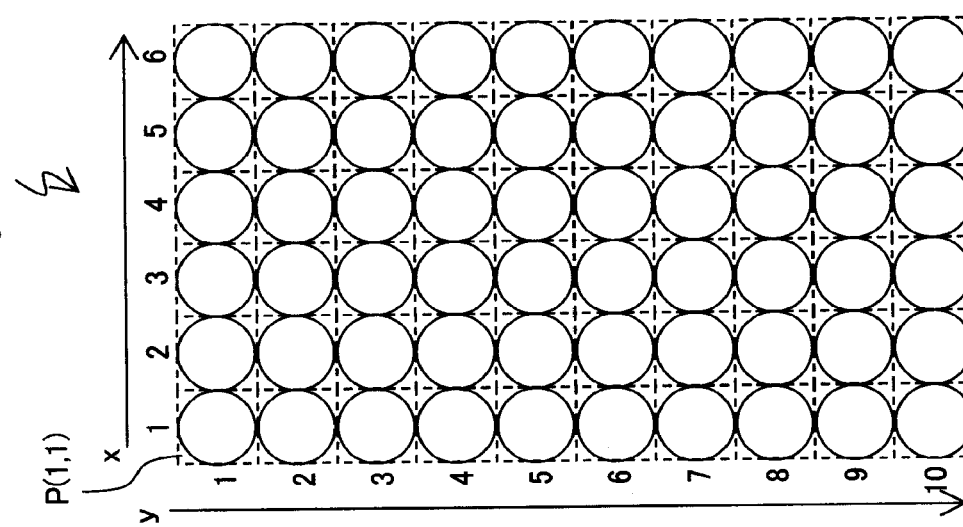
FIG. 12B is a view showing Modification 1 of the pixel arrangement.
Figure 12A:
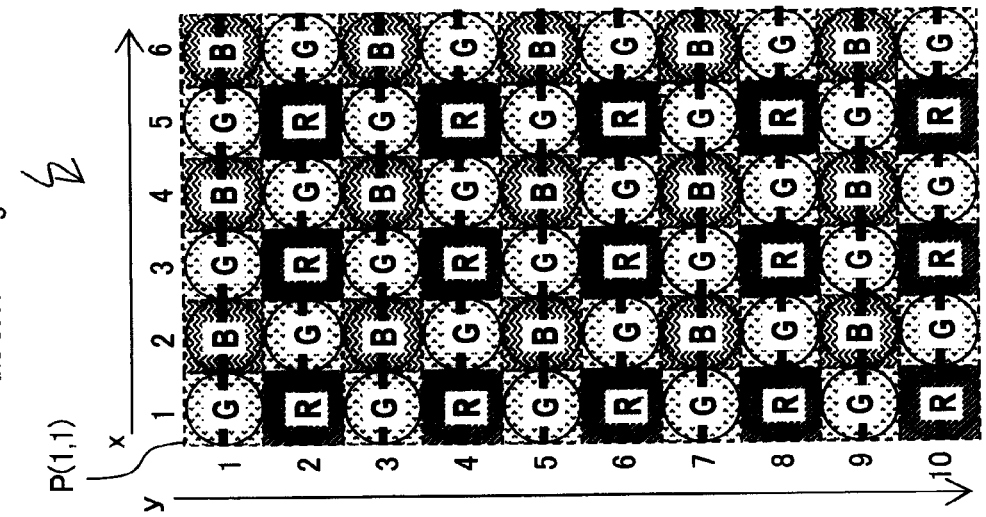
FIG. 12A is a view showing Modification 1 of the pixel arrangement.

FIGS. 12A to 12C are views showing Modification 1 of the color array of a pixel described in FIGS. 2A to 2C. In the example of FIGS. 2A to 2C, the organic photoelectric conversion film of the second image sensor 103 is adapted to correspond to three colors of Mg, Ye, and Cy, and an image signal of three colors of R, G, and B can be detected by the first image sensor 102. However, as shown in FIGS. 12A to 12C, the organic photoelectric conversion film of the second image sensor 103 may correspond to three colors of R, G, and B, and an image signal of three colors of Mg, Ye, and Cy may be detected by the first image sensor 102. Note that, even in this case, a color component the first image sensor 102 photoelectrically converts and a color component the second image sensor 103 photoelectrically converts have a complementary color relationship with each other.

(Modification 2)

Figures 13A, 13B, 13C:
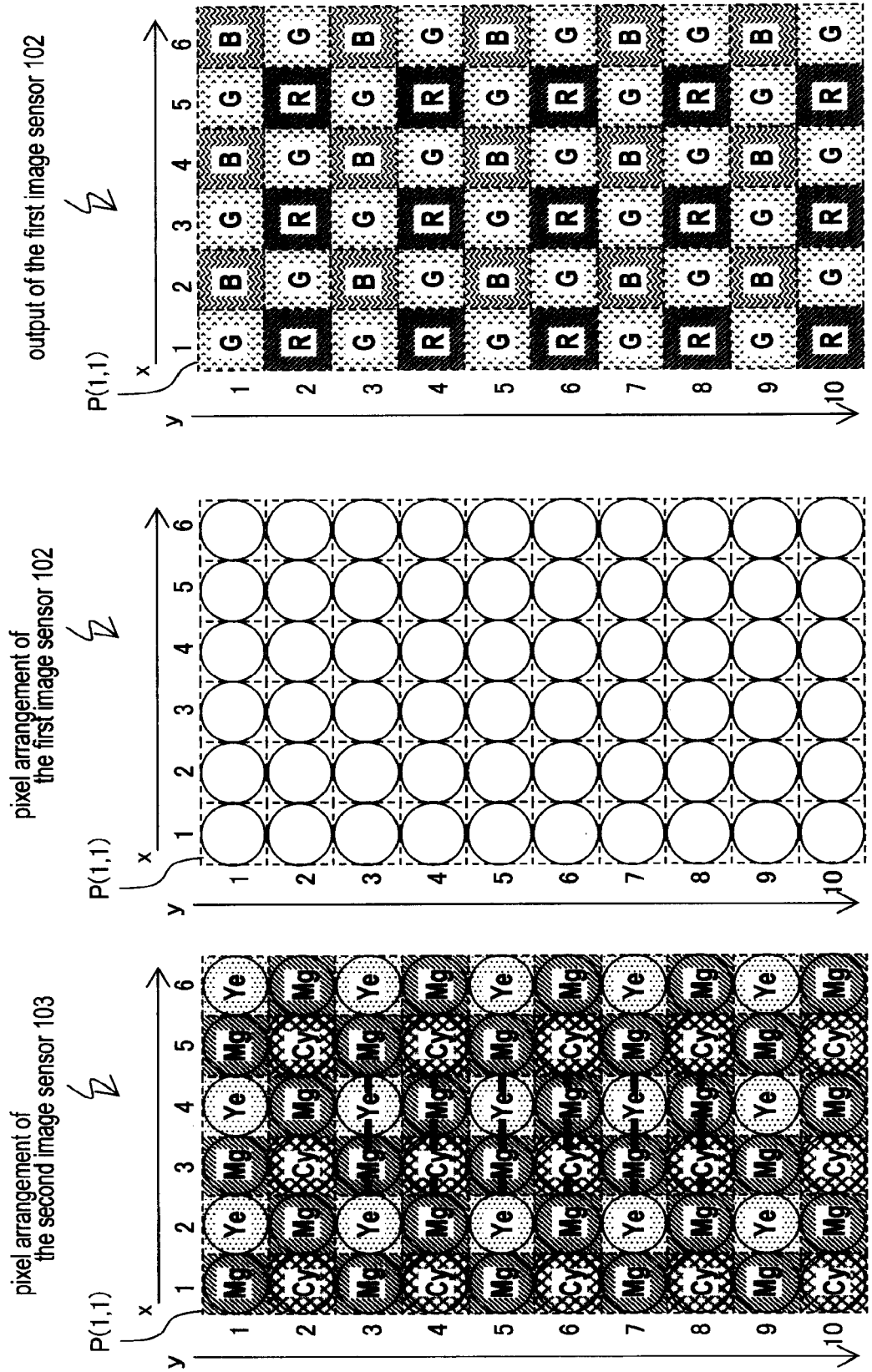
FIG. 13A is a view showing Modification 2 of the pixel arrangement.
FIG. 13B is a view showing Modification 2 of the pixel arrangement.
FIG. 13C is a view showing Modification 2 of the pixel arrangement.

FIGS. 13A to 13C are views showing Modification 2 of the color array of a pixel described in FIGS. 2A to 2C. In the examples of FIGS. 2A to 2C, a light-receiving part serving as a pair corresponding to the phase-difference AF method is arranged in each pixel of the second image sensor 103, while in the modifications of FIGS. 13A to 13C, a light-receiving part serving as a pair corresponding to the phase-difference AF method is arranged in some of the pixels of the second image sensor 103. Therefore, the circuit size of the solid-state image sensor 101 can be reduced.

(Example of Electronic Camera)

Figure 14:
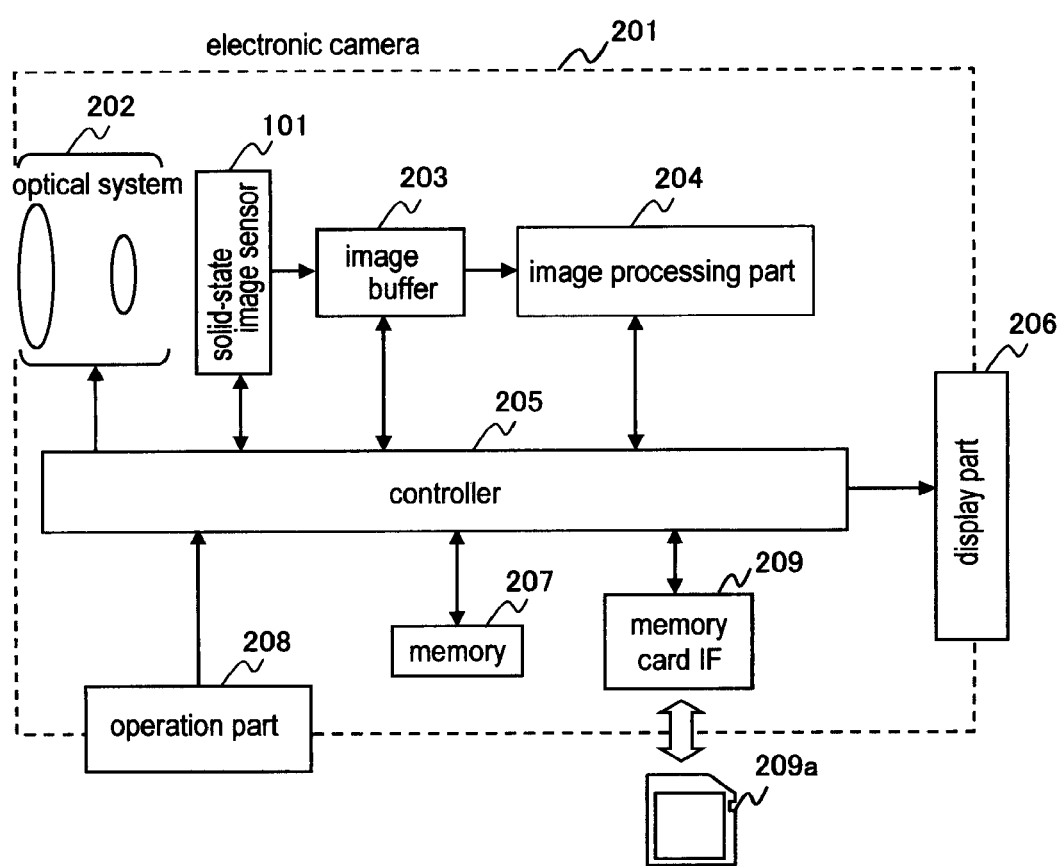
FIG. 14 is a view showing a configuration example of an electronic camera 201.

Next, an example of an electronic camera 201 mounting the solid-state image sensor 101 is shown in FIG. 14. In FIG. 14, the electronic camera 201 includes an optical system 202, the solid-state image sensor 101, an image buffer 203, an image processing part 204, a controller 205, a display part 206, a memory 207, an operation part 208, and a memory card IF 209.

The optical system 202 forms an object image on the solid-state image sensor 101. The solid-state image sensor 101 has the first image sensor 102 and the second image sensor 103, as described earlier, a signal for imaging captured by the first image sensor 102 is taken in the image buffer 203, and a signal for focus detection acquired by the second image sensor 103 is input to the controller 205. The controller 205 controls the whole electronic camera 201 in response to a user operation using the operation part 208. For example, when a release button of the operation part 208 is half-pressed, the controller 205 performs focus detection by the phase-difference AF method through the use of the signal for focus detection obtained from the second image sensor, and controls the focusing position of the optical system 202. Then, when a user fully presses the release button of the operation part 208, the controller 205 takes an image captured by the first image sensor 102 after the focus control, in the image buffer 203. Furthermore, the image taken in the image buffer 203 is subjected to white balance processing, color interpolation processing, contour enhancement processing, gamma correction processing, and the like by the image processing part 204, and is displayed on the display part 206 or stored into the memory card 209 via the memory card IF209.

Note that, when a contrast method is used, the second image sensor 103 outputs a signal for imaging, as with the first image sensor 102. Then, the controller 205 moves the focus lens of the optical system 202 while detecting the contrast of the signal for imaging which the second image sensor 103 outputs, and obtains a position of the focus lens, where the highest contrast is obtained, and sets this position to the focusing position.

In this manner, by mounting the solid-state image sensor 101 according to the present embodiment on the electronic camera 201, there is no need to perform sophisticated pixel interpolation processing by the image processing part 204 or to cause the optical system 202 to have a complicated configuration in which incoming light is divided, and the phase-difference AF method allowing for high-speed operation can be realized.

The many features and advantages of the embodiments are apparent from the detailed specification and, thus, it is intended by the appended claimed to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. An image sensor comprising:
a first image sensor including a first pixel configured to output a signal used for focus detection and including a plurality of photoelectric conversion units arranged in a first direction, and a second pixel configured to output a signal used for focus detection and including a plurality of photoelectric conversion units arranged in a second direction intersecting the first direction; and
a second image sensor including a plurality of pixels each having a photoelectric conversion unit configured to photoelectrically convert light transmitted through the first image sensor.

2. The image sensor according to claim 1, wherein the plurality of pixels included in the second image sensor is configured to output an image signal.

3. The image sensor according to claim 1, wherein the plurality of pixels included in the second image sensor includes a third pixel and a fourth pixel, the third pixel includes a photoelectric conversion unit configured to photoelectrically convert light transmitted through the first pixel, and
the fourth pixel includes a photoelectric conversion unit configured to photoelectrically convert light transmitted through the second pixel.

4. The image sensor according to claim 3, wherein
a color component of light photoelectrically converted by the photoelectric conversion unit included in the first pixel and a color component of light photoelectrically converted by the photoelectric conversion unit included in the third pixel are in a complementary color relationship, and
a color component of light photoelectrically converted by the photoelectric conversion unit included in the second pixel and a color component of light photoelectrically converted by the photoelectric conversion unit included in the fourth pixel are in a complementary color relationship.

5. An imaging device comprising the imaging sensor according to claim 1.

6. An image sensor comprising:
a first photoelectric conversion unit configured to convert light into an electrical charge;
a first output unit configured to output a first signal based on the electrical charge converted by the first photoelectric conversion unit;
a second output unit configured to output a second signal based on the electrical charge converted by the first photoelectric conversion unit; and
a second photoelectric conversion unit configured to convert light transmitted through the first photoelectric conversion unit into electrical charge,
wherein the first output unit and the second output unit are arranged between the first photoelectric conversion unit and the second photoelectric conversion unit.

7. The image sensor according to claim 6, wherein
the first photoelectric conversion unit has a first surface on which light is incident and a second surface on a side opposite to the first surface, and
the first output unit and the second output unit are arranged on the second surface.

8. The image sensor according to claim 7, wherein
the second photoelectric conversion unit converts light transmitted through the first output unit and the second output unit into electrical charge.

9. The image sensor according to claim 7, wherein
the first output unit and the second output unit are arranged to be separated from each other on the second surface.

10. The image sensor according to claim 9, wherein
the first output unit includes a first electrode that outputs the first signal, and the second output unit includes a second electrode that outputs the second signal.

11. The image sensor according to claim 10, wherein
a third electrode is arranged on the first surface so as to face the first electrode and the second electrode.

12. The image sensor according to claim 6, wherein
the first photoelectric conversion unit converts light that has passed through an optical system into electrical charge, and
the first signal and the second signal are used for focus detection of the optical system.

13. The image sensor according to claim 6, wherein
the second photoelectric conversion unit outputs a third signal for generating an image.

14. The image sensor according to claim 6, wherein the first photoelectric conversion unit transmits light in a specific wavelength region among incident light.

15. The image sensor according to claim 14, wherein the first photoelectric conversion unit is composed of an organic photoelectric film.

16. The image sensor according to claim 6, wherein a light component photoelectrically converted by the first photoelectric conversion unit and a light component photoelectrically converted by the second photoelectric conversion unit are in a complementary color relationship.

17. An imaging device comprising the imaging sensor according to claim 6.

* * * * *